United States Patent [19]

John

[11] Patent Number: 5,789,968
[45] Date of Patent: Aug. 4, 1998

[54] CONTROLLABLE SEMICONDUCTOR SWITCH

[75] Inventor: Udo John, Anzing, Germany

[73] Assignee: SGS-Thomson Microelectronics GmbH, Grasbrunn, Germany

[21] Appl. No.: 615,736

[22] Filed: Mar. 13, 1996

[30] Foreign Application Priority Data

Mar. 13, 1995 [DE] Germany .................. 195 09 024.1

[51] Int. Cl.[6] .................................................. H03K 17/687
[52] U.S. Cl. ...................... 327/436; 327/427; 327/581; 327/583
[58] Field of Search ........................ 327/77, 309, 427, 327/436, 574, 581, 583, 108

[56] References Cited

U.S. PATENT DOCUMENTS

| | | | |
|---|---|---|---|
| 4,417,164 | 11/1983 | Edlund | 327/581 |
| 4,429,339 | 1/1984 | Jaeschke et al. | 361/93 |
| 5,506,527 | 4/1996 | Rudolph et al. | 327/583 |

FOREIGN PATENT DOCUMENTS

| | | | |
|---|---|---|---|
| 0349836 A2 | 6/1989 | European Pat. Off. | H02H 11/00 |
| 0360991 A2 | 7/1989 | European Pat. Off. | H02H 11/00 |
| 409158 | 1/1991 | European Pat. Off. | |
| 0495142 A1 | 1/1991 | Germany | H02H 11/00 |

OTHER PUBLICATIONS

"Reverse Bias Over-Current Protection for Power Field-Effect Transistors," *IBM Technical Disclosure Bulletin*, vol. 29, Jul. 1986, pp. 567–569.

Antognetti, Paolo, *Power Integrated Circuits: Physics, Design, and Applications*, McGraw-Hill, NY, pp. 3.8–3.13 and 4.18–4.21, no date.

*Primary Examiner*—Timothy P. Callahan
*Assistant Examiner*—Jeffrey Zweizig
*Attorney, Agent, or Firm*—David V. Carlson; Robert Iannucci; Seed and Berry LLP

[57] ABSTRACT

An integrated semiconductor circuit comprising an output terminal connected to a ground terminal via a series connection of a first switching transistor and a second switching transistor of inverse polarization with respect to the latter, each of said switching transistors having parasitic transistors. Whether the second semiconductor switch means is conducting or not, is dependent on the current flow through a resistor connected between gate and source of the second semiconductor switch means. Whether current flows through this resistor, is dependent on the switching condition of a further switching transistor, which in turn is also determined by the output signal of a comparator circuit by means of which a potential corresponding to the potential present at output terminal is compared to a reference potential.

20 Claims, 3 Drawing Sheets

CONTROLLABLE SEMICONDUCTOR SWITCH

TECHNICAL FIELD

The invention relates to an integrated semiconductor circuit comprising a controllable semiconductor switch. In addition, it relates to the semiconductor switch on an integrated semiconductor circuit that usually comprises a number of additional circuit components constituting a control circuit.

BACKGROUND OF THE INVENTION

Transistors commonly employed for such semiconductor switch means, for example PNP transistors or VDMOS transistors, have semiconductor junctions of different conductivity types, resulting in the formation of parasitic devices such as diodes and transistors which, under specific operating conditions of the semiconductor circuit, may reach a conducting state that possibly leads to an erroneous behaviour of the semiconductor circuit.

It is basically known to take measures against undesired consequences of parasitic effects within integrated semiconductor circuits. EP 0 409 158 A1 discloses an integrated electronic semiconductor switch through which loads, such as indicator lights of motor vehicles, can be turned on and off. The switch element of this semiconductor switch is a bipolar transistor having its collector connected to the load to be switched. Between the collector of this bipolar transistor and the substrate of the integrated circuit there is formed a parasitic diode that may reach a conducting state in case the terminal of the load to be switched which is not connected to the bipolar transistor does not, as intended, have the positive potential of the vehicle battery applied thereto but instead the negative potential thereof, for example due to a wrong polarization of the battery. Such a conducting state of the parasitic diode may not only lead to a wrong electrical behaviour of the switch means but also to damage of the integrated semiconductor circuit.

As a protection to this end, the known switch means provides for a comparator having one of its inputs connected to the collector of the bipolar circuit and its other input connected to a reference potential source and having its output connected to the base of the bipolar transistor, with said base receiving in addition a switching control signal for the bipolar transistor. In case the potential applied to the load, and thus the collector voltage of the bipolar transistor, drops too much relative to the reference potential, the bipolar transistor is brought into an inversely conducting state through an output signal of the comparator. Due to the saturation voltage occurring then at the collector of the bipolar transistor, the collector is set to a potential protecting the parasitic diode against an undesired conducting state.

In a semiconductor switch on a control circuit through which an output terminal of this semiconductor circuit is switched to a low or high potential, the parasitic effects occurring there may result in that the particular potentials desired at the output terminal will not be reached.

Such output terminals of semiconductor circuits are connected for example to bus lines through which a plurality of such or similar integrated semiconductor circuits is interconnected. In accordance with the data pulses transmitted via the bus line, the output terminal of a specific semiconductor circuit, at a specific moment of time, is to have a first, e.g., high potential corresponding to logic value "1" or a second, e.g., low potential corresponding to logic value "0". The low potential usually is ground potential. If, for example, in the semiconductor circuit concerned, the connection between ground terminal of the semiconductor circuit and the external reference or ground potential is interrupted, this may have the effect that the parasitic transistor of the switching transistor connected to the output terminal becomes conducting and that, thus, a positive potential considerably higher than the external ground potential is applied to the output terminal. The bus line then will no longer be in the position to assume the correct, low potential, and falsification of data and functional disturbances of the overall system containing the improperly connected semiconductor circuit may result.

Various semiconductor circuits having their output terminals connected to a common bus line have their ground terminals usually connected to a common ground line. Due to the special distance between different integrated semiconductor circuits of the overall system, which may be quite large, e.g., in the field of automotive electronics, a considerable line resistance with a corresponding voltage drop may appear between the ground terminals of the various integrated semiconductor circuits, which may result in considerable differences in the ground potentials of the various integrated semiconductor circuits. As a consequence thereof, the output terminal of a specific integrated semiconductor circuit may have applied thereto, via the bus line, a ground potential that is quite considerably lower than the ground potential of the specific semiconductor circuit in consideration. In this case, too, the parasitic transistor of the switching transistor connected to the output terminal may reach the conducting state and may bring the output terminal and thus the bus line to a ground potential that is too high for other integrated semiconductor circuits connected to the bus line.

Attempts have already been made for countering this problem by connecting a blocking diode in series between the output terminal and the switching transistor of the integrated semiconductor circuit, with said blocking diode reaching the blocking state when the output terminal assumes a too low potential in relation to the ground potential of the integrated semiconductor circuit. When the parasitic transistor of the semiconductor switch means is switched into the conducting state due to this too low potential at the output terminal, although the semiconductor switch means itself is not conducting, a current flow via the output terminal is blocked by the parasitic transistor.

However, this solution involves the disadvantage that a voltage drop at least corresponding to the diode switching-on voltage is present at all times between the output terminal and the semiconductor switch means. As a result thereof, the potential at the output terminal, when the semiconductor switch means is in its conducting state, cannot be adjusted to an as low value as desired and, for instance, may not be below 1 V. It is desirable, however, to make the low potential at the output terminal as low as possible in order to obtain an as large as possible signal-to-noise ratio.

SUMMARY OF THE INVENTION

The present invention is to make available an integrated semiconductor circuit having a controllable semiconductor switch, in which an efficient protection against parasitic effects of the type described is provided, without this having the result of an increase in the lowest attainable potential at the output terminal of the integrated semiconductor circuit.

This is achieved by an integrated semiconductor circuit comprising one or more of the following features, according to the invention. A supply voltage terminal for supplying a supply voltage potential, a ground terminal for supplying a reference potential, and an output terminal are coupled to the circuit. The circuit includes a substrate of a first conductivity type that is connected to said ground terminal.

A series connection is provided between said output terminal and said ground terminal and including a controllable first semiconductor switch means located on the ground terminal side and a controllable second semiconductor switch means located on the output terminal side, said semiconductor switch means each having a first main path electrode, a second main path electrode and a control electrode and each containing a parasitic substrate diode which is formed by a pn-junction between the substrate and a doped region of a second conductivity type opposite to the first conductivity type, is connected without pn-junction to the first main path electrode of the particular semiconductor switch means, and is conducting when the first main path electrode has an electric potential that is beyond the instantaneous reference potential at least by a potential threshold value depending on the switching-on threshold voltage of the substrate diode as seen from the supply voltage potential.

The first main path electrodes of the two semiconductor switch means are coupled to each other in a common circuit node, the second main path electrode of the first semiconductor switch means being coupled to the ground terminal and the second main path electrode of the second semiconductor switch means being coupled to the output terminal.

An electrical resistor is provided interconnecting the control electrode and the second main path electrode of the second semiconductor switch means and having such a resistance that, when a minimum current flows therethrough, a voltage drop arises at said resistor with the effect that the second semiconductor switch means is switched into the conducting state.

A control circuit is provided which, when the first semiconductor switch means is switched into the conducting state, conducts at least said minimum current across said resistor and, when the output terminal potential exceeds a blocking threshold value beyond the instantaneous reference potential as seen from the supply voltage potential, blocks said flow of the minimum current through the resistor.

According to principles of the present invention a second semiconductor switch means is connected in series with a first semiconductor switch means, but with the polarization of the terminals being such that it is opposite to the polarization of the terminals of the first semiconductor switch means. An electrical resistor is connected between the main path terminal of the second semiconductor switch means connected to the output terminal and the control terminal thereof. In case of a predetermined minimum current through this resistor, a voltage drop is caused across the resistor which has the result that the second semiconductor switch means is switched into the conducting state. Due to the fact that the second semiconductor switch means is connected in series with the first semiconductor switch means with a polarization opposite to the polarization of the first semiconductor switch means, the parasitic transistor of the second semiconductor switch means does not have an effect on the potential at the output terminal of the semiconductor circuit. A control circuit having a signal input connected to the common circuit node and a signal output connected to said electrical resistor takes care that a sufficiently high current for activating the second semiconductor switch means flows through the resistor when the first semiconductor circuit is switched into the conducting state. In case the semiconductor circuit is faulty, no current will flow through the resistor so that the second semiconductor switch means definitely remains in its non-conducting state. When the integrated semiconductor circuit is operative, a threshold value detector circuit permanently monitors whether the potential at the output terminal reaches a range in which the parasitic transistors of the two semiconductor switch means may reach the conducting state. As soon as the threshold value detector circuit detects such a potential value at the output terminal, this circuit causes the second switch to turn off. This is accomplished by causing the minimum current for switching the second semiconductor switch means into the conducting state to no longer flow through the resistor, so that the second semiconductor switch circuit is switched into its non-conducting state.

The measures according to the invention thus make sure that parasitic effects of the semiconductor switch means connected in series with the output terminal cannot have an effect on the potential at the output terminal and that the lowest potential that can be applied to the output terminal when the first semiconductor switch means is in its conducting state is not increased by a diode voltage drop as it occurs in conventional protective circuits.

Advantageous embodiments of the invention are indicated in the dependent claims.

DETAILED DESCRIPTION OF THE INVENTION

Figure 1:
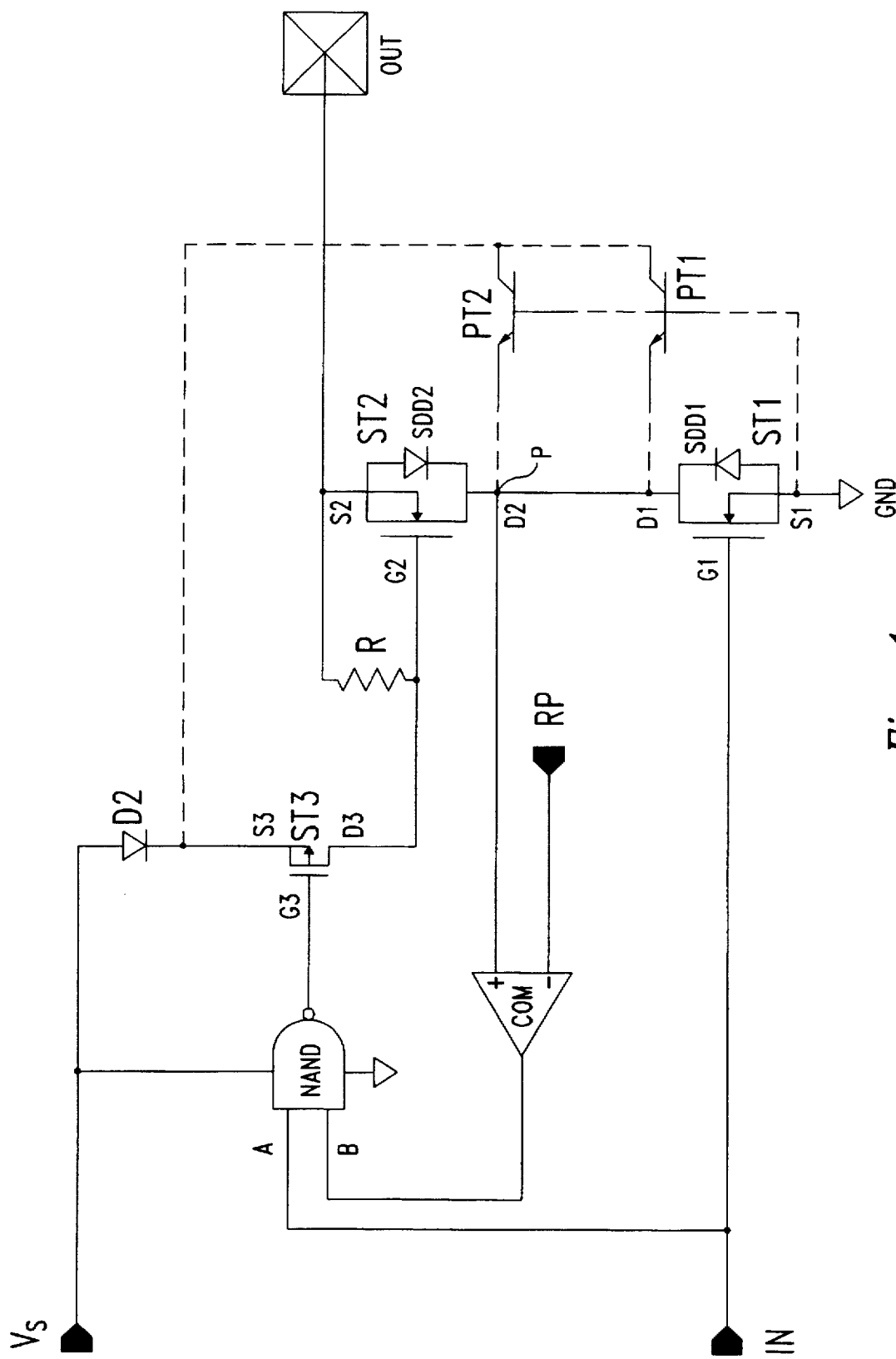
FIG. 1 shows a schematic circuit diagram of an embodiment of an integrated semiconductor circuit according to the invention.
Figure 2:
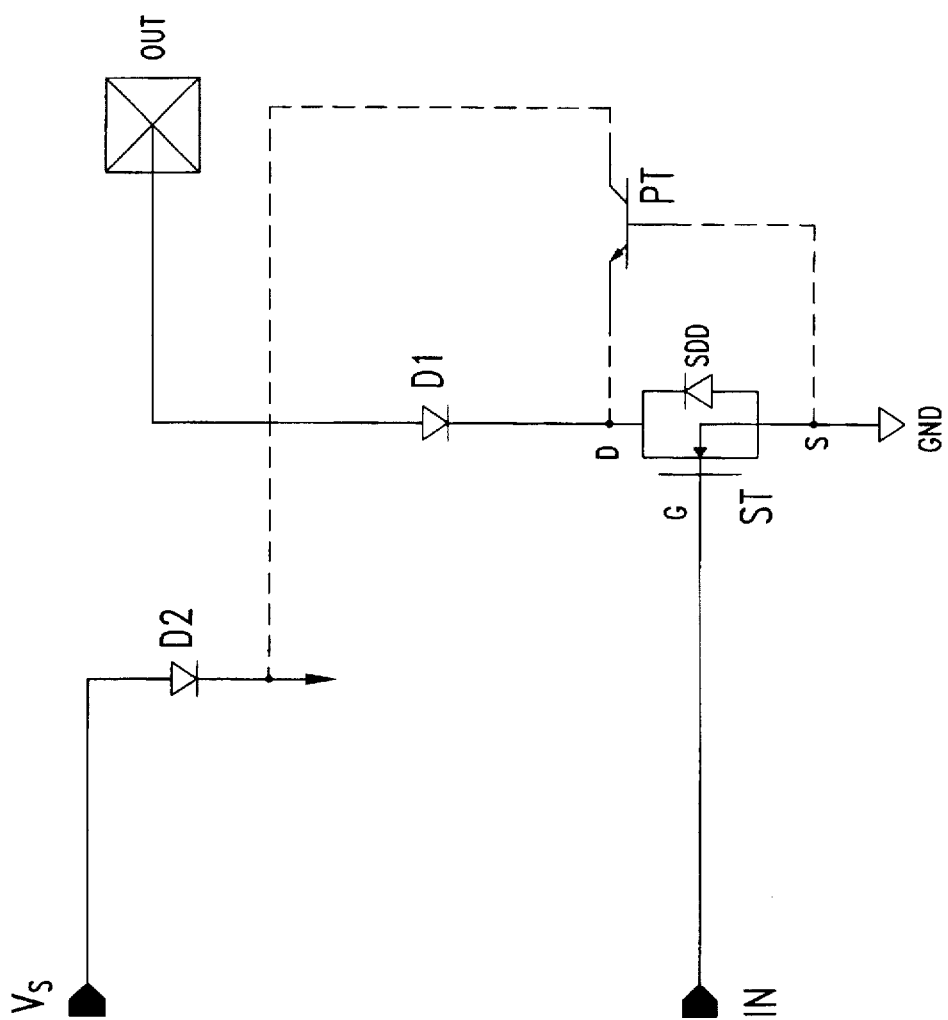
FIG. 2 shows a schematic representation of a part of a conventional circuit.
Figure 3:
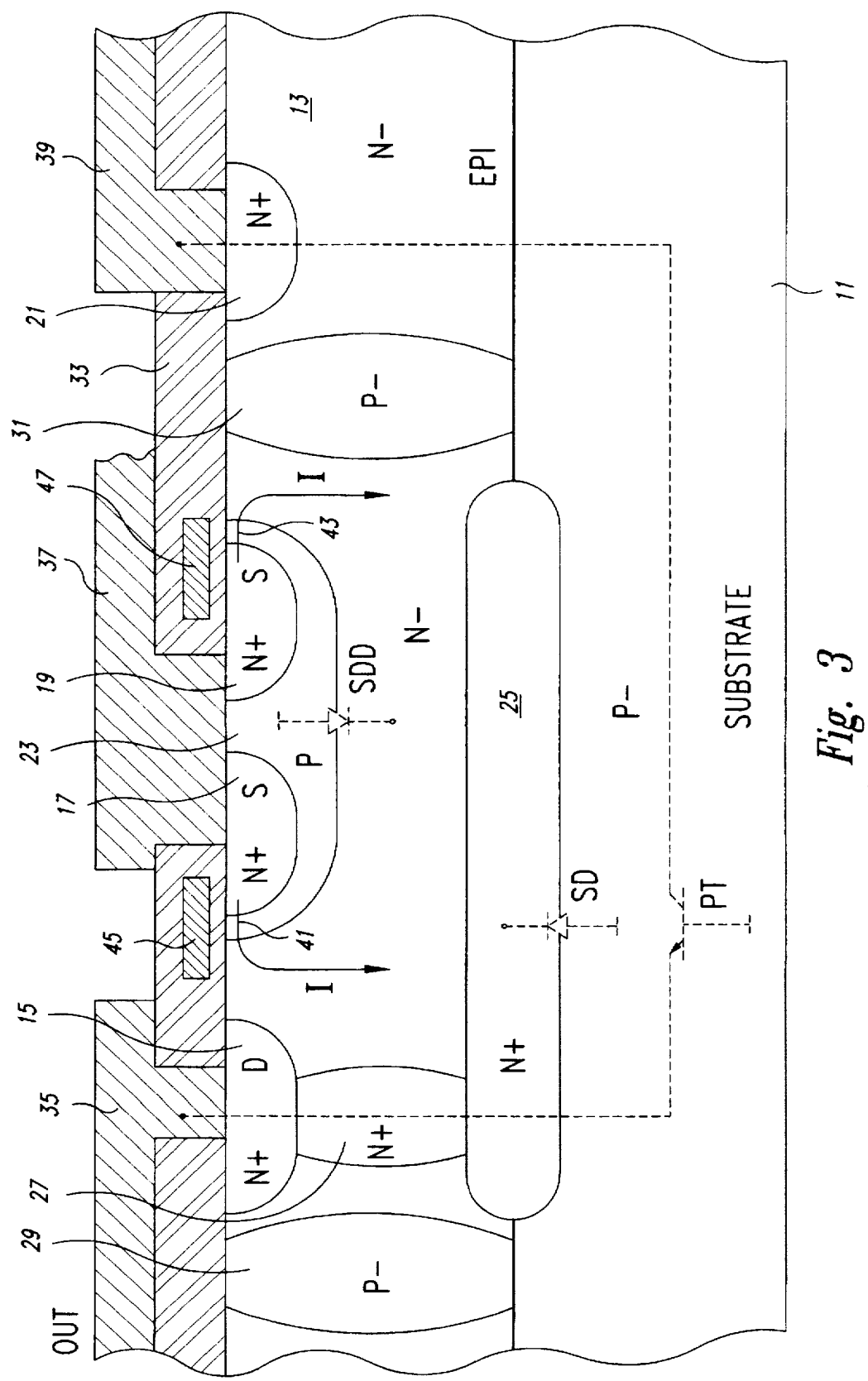
FIG. 3 shows a representation for elucidating parasitic effects in integrated semiconductor circuits.

Before explaining in more detail the invention shown in FIG. 1, the problems overcome by the invention shall be illustrated by way of FIGS. 2 and 3.

FIG. 2 shows in a schematic circuit diagram a portion of an integrated semiconductor circuit having a supply voltage terminal Vs for supply of a supply voltage potential, an input terminal IN for a control signal and an output terminal OUT provided for connection to a bus line, not shown. This circuit comprises furthermore a ground terminal GND for supply of the ground potential. Between OUT and GND there is provided a series connection of a switching transistor ST on the ground terminal side and a first diode D1 on the output terminal side. The supply voltage terminal Vs has a supply voltage line connected thereto which comprises a second diode D2 and is connected to a circuit arrangement of the integrated semiconductor circuit that is not shown in more detail in FIG. 2.

In the circuit example shown, switching transistor ST is a VDMOS (abbreviation of Vertical Double-Diffused MOS) transistor.

By means of a control signal supplied through input terminal IN, switching transistor ST is switched either into its conducting or non-conducting state, so that either ground potential or a potential in the range of the supply voltage potential or a fraction thereof appears at output terminal OUT.

Switching transistor ST comprises a drain terminal D directed to output terminal OUT, a source terminal S directed to ground terminal GND, and a gate terminal G directed to input terminal IN. In the circuit shown in FIG. 2, the supply voltage source applied to Vs has a positive potential with respect to ground terminal GND.

FIG. 3 shows a portion of a schematic sectional view, not to scale, of an integrated semiconductor circuit having a VDMOS transistor. A substrate 11 of P⁻-conductivity has an epitaxial layer 13 of N⁻-conductivity provided thereon. The surface thereof remote from substrate 11 has four regions of N⁺-conductivity type diffused thereinto, namely a drain region 15, source regions 17, 19 and a region 21. Source regions 17 and 19 are embedded in a diffusion region 23 of P-conductivity. In the transition region between substrate 11 and epitaxial layer 13, there is provided a buried layer 25 of N⁺-conductivity. Drain region 15 and buried layer 25 are connected to each other by an intermediate diffusion region 27 of N⁺-conductivity. On both sides of buried layer 25 there is provided one insulation diffusion 29 and 31, respectively, of P⁻conductivity each. The surface of epitaxial layer 13 remote from substrate 11 is covered with an insulating layer 33 provided with openings for a drain electrode 35 contacting the drain region 15, a source electrode 37 contacting source regions 17 and 19 as well as diffusion region 23, and for an additional electrode 39 contacting said further N⁺-region 21. In the surface portion of the epitaxial layer 13 adjacent insulating layer 33, between source regions 17 and 19 and the portion of epitaxial layer 13 located outside of diffusion region 23, there is located only a narrow lateral portion 41 and 43, respectively, of diffusion region 23. Above these lateral portions 41 and 43 there is provided one gate electrode each, 45 and 47, respectively, which is isolated from the surface of epitaxial layer 13 by insulating layer 33. Upon application of a suitable source-gate voltage, the potential present at gate electrodes 45, 47 generates an inversion layer in the surface portion of lateral portions 41 and 43, which renders possible a current flow, indicated by current arrows I, from source regions 17, 19 through the lateral portions 41, 43 and to buried layer 25 and thus to drain electrode 35. The PN semiconductor junction between diffusion region 23 and epitaxial layer 13 forms a source-drain diode SDD indicated in broken lines in FIG. 3. Between buried layer 25 and substrate 11, a substrate diode SD is formed, which is also shown in broken lines. Substrate diode SD is conducting when drain electrode 35 has a potential applied thereto that is lower than the potential applied to substrate 11 at least by the switching-on threshold voltage of substrate diode SD.

When an N-diffusion region in contact with an electrode, such as N⁺-region 21 in contact with electrode 39, is located outside of insulating diffusions 29 and 31 of the VDMOS transistor, the substrate diode SD becomes part of a parasitic NPN transistor shown in broken lines in FIG. 3 and designated PT. The emitter of PT is constituted by drain region 15, the collector by said further region 21 and substrate 11 acts as base of said parasitic transistor PT.

When the output terminal OUT and thus the drain electrode 35 has a potential that is below the substrate potential to such an extent that substrate diode SD is conducting, this parasitic transistor PT is conducting so that the potential of the further electrode 39 is connected through to output terminal OUT. Output terminal OUT thus is not in the position to maintain the potential it should have.

Additional information on DMOS field effect transistors and parasitic effects can be found in the book "Power Integrated Circuits: Physics, Design and Applications" by Paolo Antognetti, MacGraw-Hill Book Company, pages 3.8 to 3.13 and 4.19 to 4.21.

Reference is now being made to FIG. 2 again. In addition to the circuit components described hereinbefore, this figure shows, with connections in broken lines, the parasitic transistor PT shown and explained in connection with FIG. 3, having the base-to-emitter path constituted by the substrate diode and having collector access to a cathode-side N-diffusion region of diode D2. When assuming first that output terminal OUT is connected to the drain terminal of switching transistor ST not via diode D1, but directly, parasitic transistor PT is conducting when output terminal OUT has a potential which is more negative than the ground potential applied to ground terminal GND at least by the forward threshold voltage of substrate diode SD. As a consequence thereof, the cathode-side potential of diode D2, which is in the range of the potential of supply voltage terminal Vs when diode D2 is conducting, is connected via parasitic transistor PT through to drain terminal D of switching transistor ST and thus to output terminal OUT. The bus line connected to OUT can no longer be brought to the desired low potential, which results in a malfunction of other integrated circuits connected to the bus, and possibly in a malfunction of the entire system.

According to the suggestion already mentioned hereinbefore, diode D1 is disposed between OUT and ST. This diode blocks when the potential of OUT becomes too low and it then prevents a current flow through PT so that the latter cannot switch a positive potential applied to the collector thereof through to output terminal OUT.

This involves the afore-mentioned disadvantage that a voltage drop corresponding to the connecting-through threshold of diode D1 is present between OUT and the drain terminal of ST when ST is in the conducting state. The result hereof is that the potential at output terminal OUT can not become lower than 1 V. Due to the fact that various integrated circuits, when spaced apart from each other by larger distances, because of the afore-mentioned ground line resistance may have different ground potentials that possibly differ from each other by up to about 2 V, the additional potential increase at OUT caused by the voltage drop across diode D1 is too high for obtaining a sufficiently safe signal-to-noise ratio on the bus line connected to OUT.

The circuit arrangement shown in FIG. 1 and depicting a preferred embodiment of the invention overcomes the problems mentioned.

In the embodiment of the invention shown in FIG. 1, a series connection of a first switching transistor ST1 on the ground terminal side and a second switching transistor ST2 on the output terminal side is provided between output terminal OUT and ground terminal GND. The two transistors ST1 and ST2 are each composed of a VDMOS transistor in one embodiment. ST2 is inserted in this series connection with a polarization of its source and drain terminals that is opposite to the polarization of the terminals of ST1. That is, the drain terminals D1 and D2 of both switching transistors ST1 and ST2 are connected to each other, and the source terminal S1 of ST1 is connected to GND and the source terminal S2 of ST2 is connected to OUT. Gate terminal G1 is connected to an input terminal IN through which switching control signals for ST1 are supplied. Between the gate terminal G2 and the source terminal S2 of ST2 there is connected a resistor R. The resistance thereof is such that, with a minimum current flow through R, a voltage drop is created at this resistor which is in excess of the source-gate switching-on threshold voltage of ST2, which in practical embodiments of ST2 is about 1.5 V. The drawing shows for both switching transistors ST1 and ST2 the inherent source-drain diode SDD1 and SDD2 thereof, respectively, acting like a diode connected in parallel to the VDMOS transistor. Due to the polarization chosen for the terminals of ST2, SDD2 has the same polarization as diode D1 in FIG. 2.

Both switching transistors ST1 and ST2 have a parasitic transistor PT1 and PT2, respectively, as described in connection with FIGS. 2 and 3. Due to the polarization of ST2 opposite to the polarization of ST1, a potential connected through from the collector side of parasitic transistor PT2 to the drain terminal D2 of ST2 does not have an effect on the potential of output terminal OUT.

The circuit shown in FIG. 1 comprises furthermore a comparator COM having its non-inverting input connected to circuit point P common to both drain terminals D1 and D2 and having its inverting input connected to a reference voltage potential source RP. The circuit arrangement according to FIG. 1 comprises moreover a NAND gate circuit having one input A thereof connected to input terminal IN and its other input B connected to the output of comparator COM. The output of NAND is connected to a gate terminal G3 of a switching transistor ST3 designed as a MOS transistor and having its drain terminal D3 connected to the gate terminal G2 of ST2. The source terminal S3 of ST3 is connected to supply voltage terminal Vs via a diode D2.

Comparator COM delivers at its output a predetermined output signal when the potential present at drain terminals D1 and D2 becomes lower than reference potential RP. This means, whenever the potential at output terminal OUT becomes lower than a predetermined potential value, comparator COM delivers an output signal indicating to such a situation.

The resistance of resistor R is selected such that, when switching transistor ST3 is in its conducting state, a current flows through R which entails such a voltage drop across R that switching transistor ST2 is switched into the conducting state.

The comparator COM, the NAND gate circuit and the switching transistor ST3 constitute a control circuit, with the non-inverting+ input of comparator COM forming a signal input and the drain terminal of switching transistor ST3 forming a signal output. The signal input of the control circuit thus is connected to circuit point P, and its signal output is connected to resistor R.

In the following, the mode of operation of the circuit shown in FIG. 1 shall be explained. It is assumed in this respect that ground terminal GND is to have a potential of 0 V, whereas a positive potential is applied to supply voltage terminal Vs, with respect to the ground potential.

When a control signal with the logic value "0" is present at input terminal IN, ST1 is in its non-conducting state. Moreover, this results in a logic value "1" at the output of NAND so that ST3 is non-conducting. As a consequence thereof, no current is supplied via resistor R and ST2 remains non-conducting as well. Due to the non-conducting state of ST1 and ST2, the potential present at ground terminal GND is not connected through to output terminal OUT. Of the two source-drain diodes SDD1 and SDD2 inherently present in switching transistors ST1 and ST2, respectively, at least one thereof is blocked irrespective of the potential at output terminal OUT. When the output terminal potential at OUT is positive with respect to the ground potential at GND, SDD1 blocks. In case the output terminal potential drops below such a value that SDD1 is conducting, SDD2 blocks. Due to the lack of a conducting connection between OUT and GND, the output potential at GND thus is determined only by the potential supplied via the bus line by other components of the bus line system. The integrated circuit is thus protected.

In the event that input terminal IN is fed with a logic signal "1" of high potential value, which switches switching transistor ST1 into the conducting state, it is assumed first that output terminal OUT has a potential applied thereto which, at the connecting node P between the two switching transistors ST and ST2 serving a voltage divider point, causes a potential that is higher than reference potential RP. Under these circumstances, comparator COM delivers a logic value "1" as output signal. Thus, the logic value "1" is present at the two inputs A and B of NAND, so that the logic value "0" is fed from the output of NAND to switching transistor ST3. ST3 thus is also in its conducting state. As a result thereof, a current flows through resistor R leading to a sufficient voltage drop for switching transistor ST2 into its conducting state as well. The series connection between OUT and GND, consisting of the two switching transistors ST1 and ST2, thus is in its conducting state and the ground potential present at ground terminal GND is supplied to output terminal OUT. The source-drain diodes SDD1 and SDD2 that are inherently contained in switching transistors ST1 and ST2 and, due to the inverse polarization of ST2 with respect to ST1, are connected in series with an opposite polarization, are each shorted by the conducting switching transistors ST1 and ST2, respectively, and thus have no effect.

The protective effect of the protective circuit comprising ST2, ST3 and R shall now be elucidated by way of three cases against which protection is necessary.

1. Functional failure of the integrated semiconductor circuit concerned.
2. GND potential failure.
3. Output terminal potential is too low with respect to ground potential of the semiconductor circuit concerned.

Case 1: In case of a substantial failure in the function of the integrated semiconductor circuit concerned, ST3 is non-conducting so that no current adapted to switch on switching transistor ST2 can flow through resistor R. The connection between OUT and GND thus remains blocked.

Case 2: In case a GND potential failure occurs for example because the ground lead to the ground terminal of the integrated semiconductor circuit is defective, the ground potential of the integrated semiconductor circuit concerned is in the floating, i.e., indefinite state. This may have the result that a potential is present at output terminal OUT which, with respect to the floating ground potential of the integrated semiconductor circuit concerned, is so low that the partial potential at connecting node P becomes lower than reference potential RP. Logic value "0" then appears at the output of comparator COM, entailing a logic value "1" at the output of NAND and thus blocking of ST3. The current flow through resistor R is interrupted thereby, which brings ST2 into the nonconducting state. The positive potential on the cathode side D2 or another circuit component of the integrated semiconductor circuit, comprising an N-conducting region forming a collector for parasitic transistor PT2, cannot be connected through to output terminal OUT even if substrate diode SD2 of ST2 and, thus, parasitic transistor PT2 are conducting, due to the blocking of ST2. Due to the inverse polarization of ST2 this positive potential cannot reach OUT via the inherent source-drain diode SDD2 thereof, either.

Case 3: In case the integrated semiconductor circuit concerned has an individual ground potential that is higher than the individual ground potential of another integrated semiconductor circuit connected via a bus line to output terminal OUT of the integrated semiconductor circuit in consideration, for example due to the aforementioned voltage drop on the ground line interconnecting two integrated semiconductor circuits, it may also happen that a potential is applied to the output terminal that is lower than the individual ground potential at ground terminal GND of the integrated semiconductor circuit concerned. In this case, too, the partial potential at connecting node P drops below the value of the reference potential RP, with the same result as in case 2: ST3 and thus ST2 are switched off, SDD2 blocks, and neither the individual ground potential at terminal GND nor a positive potential reaching drain terminals D1 and D2 via parasitic transistor PT1 and/or parasitic transistor PT2 can reach output terminal OUT.

An embodiment has been considered hereinbefore in which protection is achieved against parasitic effects of VDMOS transistors. However, such parasitic effects occur also with other transistor types, for example bipolar NPN transistors. The circuit according to the invention provides protection in this case as well.

The embodiment according to FIG. 1 has been considered for the case that the supply voltage potential is positive with respect to the ground potential of the integrated semiconductor circuit. The protective measure according to the invention is also applicable when an opposite polarization is employed, i.e., a negative supply voltage potential with respect to the ground potential. In that case, switching transistors ST1 to ST3 may be employed whose conductivity types are opposite to those of the switching transistors provided in FIG. 1, with ST2 being connected with respect to ST1 with an inverse polarization, as has been explained.

The protective circuit finds use in the field of automotive electronics. Under the rough environmental conditions present with respect to the electronics system of motor vehicles, problems such as GND or ground interruption may occur particularly easily. This invention protects the electronic circuits in the event of such problems. Due to the large distance that may be present between integrated circuits located on the same bus line system, the mutual difference of the individual ground potentials of the individual spaced apart integrated semiconductor circuits is especially serious in the field of automotive electronics as well. The invention provides a solution to this problem also.

The circuit according to the invention shows its benefits also as EMI protection (protection against electromagnetic interference). Both in case of interference pulses in the positive direction, which have an effect on the individual ground potential of the integrated semiconductor circuit in consideration, and in case of negative interference pulses, which reach the output terminal OUT of the particular integrated semiconductor circuit from the outside, the protective deactivation according to the invention becomes effective.

The circuit according to the invention also provides protection against a mis-polarized connection of a battery in which a potential considerably lower than the potential applied to ground terminal GND may reach the output terminal OUT.

I claim:

1. An integrated semiconductor circuit comprising:
    a first semiconductor switching device having a first terminal coupled to ground, a control terminal coupled to an input terminal and a third terminal coupled to a common node;
    a second semiconductor switching device having a first terminal connected to said common node, a control terminal and a third terminal connected to an output signal line such that the second semiconductor switching device is in a series connection between the first semiconductor switch and the output signal line;
    a control circuit having an output terminal connected to the control terminal of the second semiconductor switching device and having a first input terminal connected to said common node and having a second input terminal, wherein said control circuit further includes an impedance device connected between said third terminal and said control terminal of said second semiconductor switching device; and
    a reference potential connected to said second input terminal, said control circuit adapted to switch said second semiconductor switch to an open state to prevent current flow between the output signal line and the first semiconductor switch if the voltage at the common node is lower than the reference potential at the second input terminal of the control circuit.

2. The circuit according to claim 1 wherein the control circuit comprises:
    a third semiconductor switching device provided with a control terminal and having a main path that is connected between the supply voltage terminal and the control terminal of the second semiconductor switching device; and
    a comparator circuit having first and second inputs and an output, the first input and second inputs being the first and second input terminals, respectively, and the output of the comparator circuit being connected to the control terminal of the third semiconductor switching device, wherein the third semiconductor switching device is switched into an open state by the comparator circuit when the voltage of the common node is lower the reference potential, the second semiconductor switching device being switched to an open state in response to the third semiconductor switching device being switched to the open state.

3. The circuit according to claim 2 wherein the control circuit further includes a NAND gate having first and second inputs and an output, the first input of the NAND gate being connected to the output of the comparator circuit, the second input of the NAND gate being connected to an input terminal of the semiconductor circuit, and the output of the NAND gate being connected to the control input of the third semiconductor switching device, wherein the output of the NAND gate opens the third semiconductor switching device in response to the output of the comparator circuit changing state in response to the voltage at the common mode being lower than a predetermined threshold above the reference potential.

4. The circuit according to claim 1 wherein said second semiconductor switching device includes an MOS device having its drain connected to the common node and having its source connected to the output signal line and its gate connected to the output of the control circuit such that the first and second semiconductor devices are coupled in a common drain mode.

5. The circuit according to claim 1 wherein said impedance device is a resistor.

6. The circuit according to claim 1 wherein said control circuit includes a comparator having one input terminal connected to the common node and another input terminal connected to a threshold voltage for outputting a signal of a first state when the voltage potential of the common node is below the threshold value and outputting a signal of a second state when the voltage potential of the common node is above the reference voltage.

7. An integrated semiconductor circuit comprising:
    a first semiconductor switching device having a first terminal coupled to ground, a control terminal coupled to an input terminal and a third terminal coupled to a common node;

a second semiconductor switching device having a first terminal connected to said common node, a control terminal and a third terminal connected to an output signal line such that the second semiconductor switching device is in a series connection between the first semiconductor switch and the output signal line;

a control circuit having an output terminal connected to the control terminal of the second semiconductor switching device and having a first input terminal connected to said common node and having a second input terminal; and a reference potential connected to said second input terminal, said control circuit adapted to switch said second semiconductor switch to an open state to prevent current flow between the output signal line and the first semiconductor switch if the reference voltage at the common node is lower than the reference potential input to the input terminal of the control circuit;

wherein said control terminal of said first semiconductor switch and said control circuit are coupled together and further including an input signal line coupled to said control circuit and to said control terminal of said first semiconductor switch.

8. A method of protecting a semiconductor circuit, comprising:

sensing a voltage level at a common node within said semiconductor circuit;

comparing the voltage of said common node to a reference voltage;

connecting said common node to a ground potential via a first semiconductor switching device;

connecting said common node to an output signal line via a second semiconductor switching device;

opening said second semiconductor switching device to prevent current flow to said common node when the voltage of said common node is lower than a preselected threshold value;

receiving an input signal at an input terminal of said first semiconductor switching device;

receiving said input signal at an input terminal of a control circuit;

receiving a reference potential at another input terminal of said control circuit; and outputting a control signal from said control to terminate current flow through said second semiconductor switch when the voltage at said common node is lower than the said reference potential at said another input terminal.

9. An integrated semiconductor circuit comprising:

a supply voltage terminal for supplying a supply voltage potential, a ground terminal for supplying a reference potential, and an output terminal;

a substrate of a first conductivity type and connected to said ground terminal;

a series connection provided between said output terminal and said ground terminal and including a controllable first semiconductor switch means located on the ground terminal side and a controllable second semiconductor switch means located on the output terminal side, said semiconductor switch means each having a first main path electrode, a second main path electrode and a control electrode and each containing a parasitic substrate diode which is formed by a pn-junction between the substrate and a doping region of a second conductivity type opposite to the first conductivity type, is connected without pn-junction to the first main path electrode of the particular semiconductor switch means, and is conducting when the first main path electrode has an electric potential that is beyond the instantaneous reference potential at least by a potential threshold value depending on the switching-on threshold voltage of the substrate diode as seen from the supply voltage potential;

the first main path electrodes of the two semiconductor switch means being coupled to each other in a common circuit point, the second main path electrode of the first semiconductor switch means being coupled to the ground terminal and the second main path electrode of the second semiconductor switch means being coupled to the output terminal;

an electrical resistor interconnecting the control electrode and the second main path electrode of the second semiconductor switch means and having such a resistance that, when a minimum current flows therethrough, a voltage drop arises at said resistor with the effect that the second semiconductor switch means is switched into the conducting state; and a control circuit comprising a signal input and a signal output, with the signal input being coupled to the common circuit point and the signal output being coupled to said electrical resistor, and said control circuit, when the first semiconductor switch means is switched into the conducting state, being adapted to conduct at least said minimum current across said resistor and, when the output terminal potential passes a blocking threshold value beyond the instantaneous reference potential as seen from the supply voltage potential, being adapted to block said flow of the minimum current through the resistor.

10. A semiconductor circuit according to claim 9 wherein said control circuit comprises a threshold detector circuit detecting that the blocking threshold value is reached.

11. A semiconductor circuit according to claim 9 wherein said first semiconductor switch means is constituted by a first VDMOS transistor and the second semiconductor switch means is constituted by a second VDMOS transistor, and the first main path electrodes are constituted by the drain electrodes thereof and the second main path electrodes are constituted by the source electrodes thereof and the control electrodes by the gate electrodes thereof.

12. A semiconductor circuit according to claim 11 wherein the two VDMOS transistors are each constituted by an N-channel VDMOS transistor, the supply voltage potential is positive with respect to the reference potential, the parasitic substrate diodes of said first semiconductor switch means is conducting when the drain electrode of said first semiconductor switch means is at a potential that is below the instantaneous reference potential at least by the switching-on threshold voltage of the substrate diode, and the control circuit prevents the flow of the minimum current through resistor when the output terminal potential drops below a threshold value that is below the instantaneous reference potential by a predetermined amount.

13. A semiconductor circuit according to claim 9 wherein the first semiconductor switch means is constituted by a first NPN transistor and the second semiconductor switch means by a second NPN transistor, and the first main path electrodes are constituted by the collectors thereof, the second main path electrodes by the emitters thereof and the control electrodes by the base electrodes thereof.

14. A semiconductor circuit according to claim 9 wherein the output terminal constitutes a bus line terminal.

15. A semiconductor circuit according to claim 9 wherein the control circuit comprises:
   a third semiconductor switch means provided with a control terminal and having a main path that is connected between the supply voltage terminal and the control terminal of the second semiconductor switch means, and a comparator circuit provided with an inverting input and a non-inverting input and having its inverting input connected to a reference potential source determining the blocking threshold value, having its non-inverting input connected to the common circuit point between the first two semiconductor switch means, and having its output connected to the control terminal of the third semiconductor switch means, with said third semiconductor switch means being switched into the non-conducting state by the output signal of the comparator circuit when the potential of the common circuit point has dropped at least to the reference potential.

16. A semiconductor circuit according to claim 15 wherein a NAND gate circuit having two inputs and one output is disposed between the output of the comparator circuit and the control terminal of the third semiconductor switch means, one input of said NAND gate circuit is connected to the output of the comparator circuit and its other input is connected to the input terminal of the semiconductor circuit, with the input terminal being fed with a switching control signal for the first semiconductor switch means, and wherein the output of said NAND gate circuit is connected to the control input of the third semiconductor switch means.

17. A semiconductor circuit according to claim 15 wherein the third semiconductor switch means is constituted by a MOS transistor having its source connected to the supply voltage terminal, its drain to the control terminal of the second semiconductor switch means and its gate to the output of the NAND gate circuit.

18. A semiconductor circuit according to claim 15 wherein the third semiconductor switch means is constituted by an NPN transistor having its collector connected to the supply voltage terminal, its emitter to the control terminal of the second semiconductor switch means and its base to the output of the NAND gate circuit.

19. A semiconductor circuit according to claim 17 wherein a diode is provided having an anode side and a cathode side, with the anode side being connected to the supply voltage terminal and the cathode side being connected to the source of the MOS transistor.

20. A semiconductor circuit according to claim 18, further comprising a diode having an anode side and a cathode side, with the anode side being connected to the supply voltage terminal and the cathode side being connected to the collector of the NPN transistor.

\* \* \* \* \*